(12) United States Patent  
Werner

(10) Patent No.: US 7,714,365 B2
(45) Date of Patent: May 11, 2010

(54) SEMICONDUCTOR COMPONENT WITH SCHOTTKY ZONES IN A DRIFT ZONE

(75) Inventor: Wolfgang Werner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 160 days.

(21) Appl. No.: 12/034,810

(22) Filed: Feb. 21, 2008

(65) Prior Publication Data
US 2009/0212331 A1 Aug. 27, 2009

(51) Int. Cl.
*H01L 29/80* (2006.01)
(52) U.S. Cl. .................. 257/263; 257/256; 257/280; 257/328; 257/329
(58) Field of Classification Search .......... 257/155, 257/263, 475, 483; 438/92, 134
See application file for complete search history.

(56) References Cited

U.S. PATENT DOCUMENTS

2003/0020134 A1* 1/2003 Werner et al. ............... 257/471

FOREIGN PATENT DOCUMENTS

| DE | 4309764 C2 | 9/1994 |
|---|---|---|
| DE | 19815907 C1 | 5/1999 |
| DE | 19604044 C2 | 1/2002 |

OTHER PUBLICATIONS

Sze: "Semiconductor Devices", 2nd Edition, pp. 231, 232, Copyright 1985, (2002) by John Wiley & Sons.
Fathauer et al., "Columnar Growth of CoSi2ON Si(111) and Si(110) by Molecular Beam Epitaxy", Thin Solid Films, 184(1990) 335-342.

* cited by examiner

*Primary Examiner*—N Drew Richards
*Assistant Examiner*—Kyoung Lee
(74) *Attorney, Agent, or Firm*—Dicke, Billig & Czaja, PLLC

(57) ABSTRACT

A description is given of a semiconductor component comprising a drift zone of a first conduction type and at least one Schottky metal zone arranged in the drift zone, and of a method for producing a semiconductor component.

22 Claims, 9 Drawing Sheets ively to the drift zone, the further component zone being a source zone, and the compensation zones being a plurality of Schottky metal zones 41—arranged in the drift zone 11. The
SEMICONDUCTOR COMPONENT WITH SCHOTTKY ZONES IN A DRIFT ZONE

BACKGROUND

One aim when realizing semiconductor components, in particular when realizing so-called power semiconductor components, is to achieve a lowest possible on resistance for a given dielectric strength of the component. In the case of compensation components, this is achieved by arranging compensation zones in a doped drift zone of the component, the compensation zones being doped complementarily to the drift zone. When the component is driven in the off state, that is to say when a space charge zone propagates in the drift zone, part of the dopant charge present in the drift zone is compensated for by the dopant charge present in the compensation zones, that is to say that dopant atoms in the drift zone which are ionized when the component is in the off state find a corresponding counter charge in the compensation zones. For the same dielectric strength as in the case of a component without compensation zones, in the case of a compensation component it is possible to provide a higher doping of the drift zone, which results in a lower on resistance in comparison with a non-compensation component.

When the component is driven in the off state, the compensation zones of a compensation component are charged. If an n-conducting component is considered, for example, wherein the drift zone is n-doped and wherein the compensation zone is p-doped, then holes flow away from the compensation zones when the component is driven in the off state. If the component is driven in the on state again at a later point in time, then the holes have to be fed to the compensation zones again, that is to say that the compensation zones have to be discharged, in order to achieve the desired low on resistance.

In order to reliably ensure such a discharge, the compensation zones can be connected to a further component zone, in the case of a MOSFET for example to the source zone thereof. However, such fixed connection of the compensation zones to one of the further component zones restricts freedom in the design of the component.

Furthermore, the dimensions of the doped compensation zones cannot be shrunk arbitrarily, which is at odds with a shrink of the component dimensions that is striven for.

SUMMARY

One embodiment provides a semiconductor component including a drift zone of a first conduction type and including at least one Schottky metal zone arranged in the drift zone.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
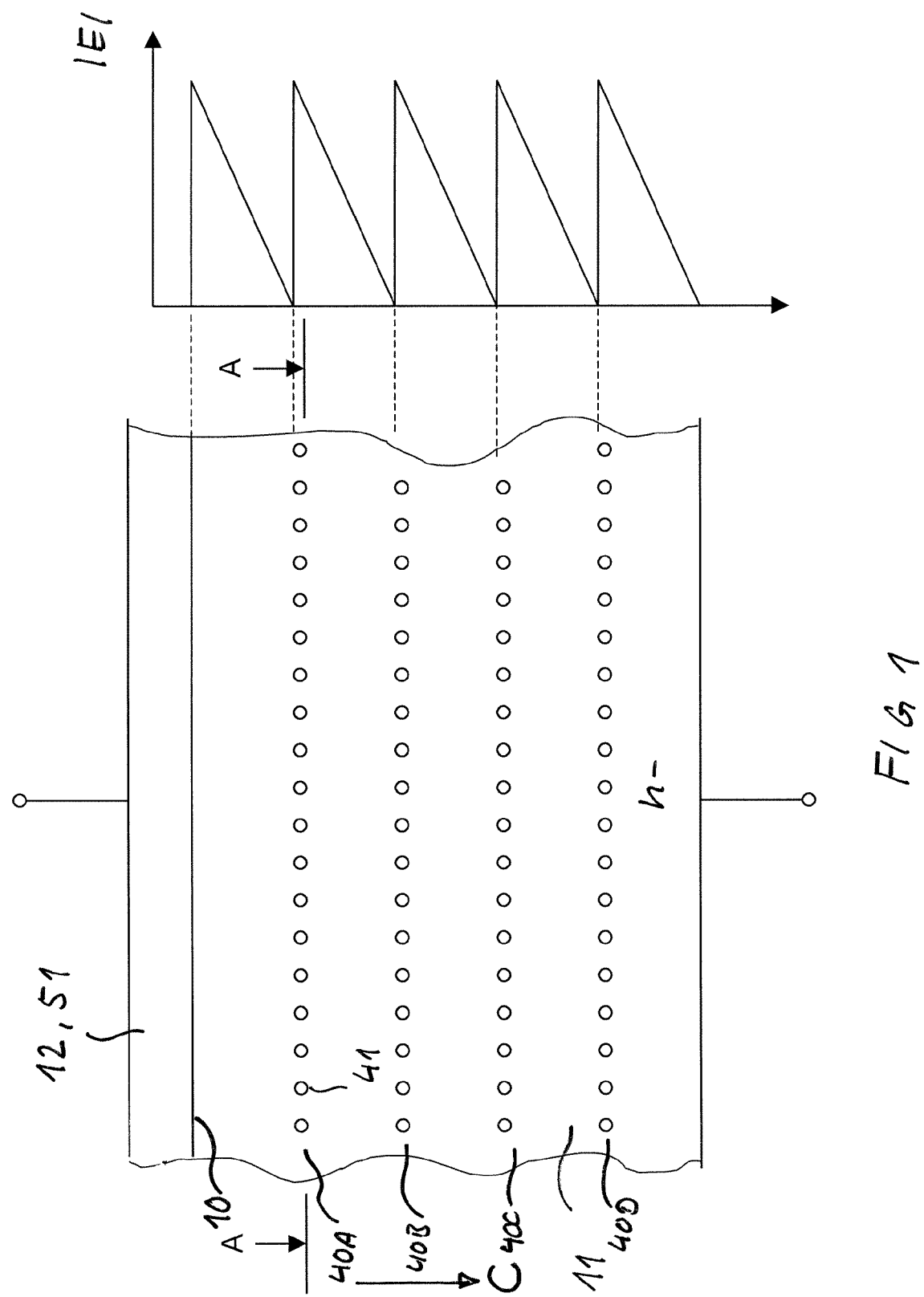
FIG. 1 illustrates an excerpt from a cross section through a semiconductor component including a drift zone with at least one Schottky metal zone.

FIG. 1 illustrates an excerpt from a cross section through a semiconductor component including a drift zone 11 and at least one Schottky metal zone—in the example a plurality of Schottky metal zones 41—arranged in the drift zone 11. The component can assume an on state and an off state. In this case, the drift zone 11 is the component zone in which a space charge zone propagates proceeding from a component junction 10 when the component is in the off state. In this case, the component junction 10 is a pn junction or a Schottky junction and is arranged between the drift zone 11 and a first component zone. In this case, the first component zone is either a semiconductor zone 12 doped complementarily to the drift zone 11, which semiconductor zone forms a pn junction with the drift zone 11, or a further Schottky metal zone 51, which forms a Schottky junction with the drift zone 11.

For the further explanation it shall be assumed that the drift zone 11 is an n-doped semiconductor zone. The doping concentration of the drift zone lies for example between $10^{14} cm^{-3}$ and $10^{16} cm^{-3}$. The component junction 10 between the drift zone 11 and the further component zone 12, 51 is turned off in this case when a positive voltage is present between the drift zone 11 and the first component zone 12, 51. Connections for applying such a voltage between the drift zone 11 and the first component zone 12, 51 are illustrated only schematically in FIG. 1.

In FIG. 1, C designates a current flow direction. That is the direction in which a current flows through the component when the latter is in the on state or is driven in the on state. In FIG. 1, C designates the technical current direction; the physical current direction, that is to say the direction of the flow of electrons, runs in the opposite direction. Since technical and physical current direction differ only in the sign of their direction, for the following explanation no distinction is drawn between technical and physical current direction if this is not essential at the respective point.

The component can have one or a plurality of levels or layers in which one or a plurality of Schottky metal zones 41 are arranged in each case. In the component illustrated in FIG. 1, four such levels 40A-40D are present, by way of example, in each of which one or a plurality of Schottky metal zones 41 are arranged. The individual levels having in each case one or in each case a plurality of Schottky metal zones 41 run for example perpendicular to the current flow direction C. These levels with Schottky metal zones 41 arranged therein are referred to hereinafter as Schottky metal levels.

Figure 2C:
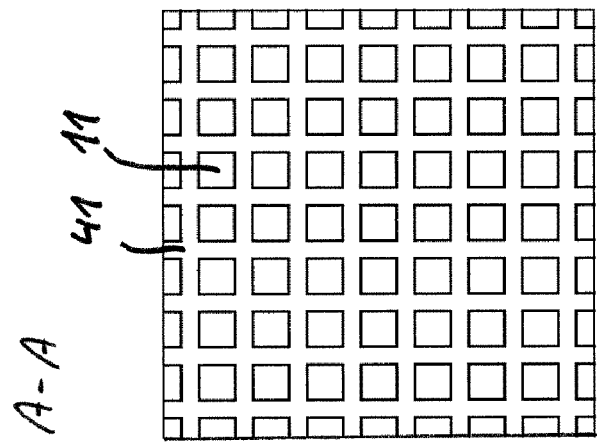
FIG. 2 illustrates examples of different possible geometries of the Schottky metal zone.
Figure 2B:
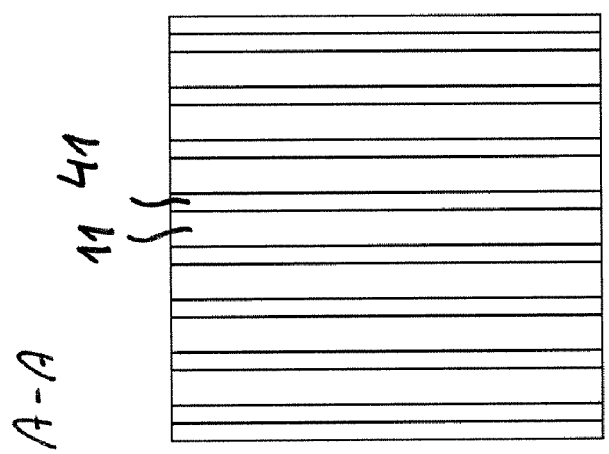
Figure 2A:
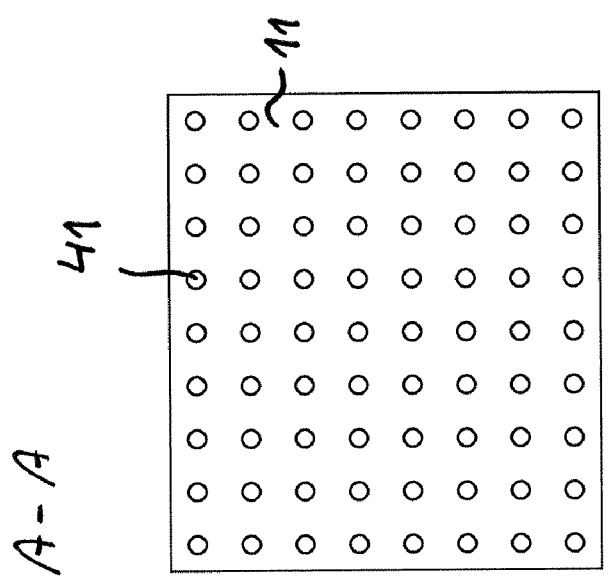

FIGS. 2A to 2C in each case illustrate a cross section through the drift zone 11 in one of the Schottky metal levels and serve for elucidating various examples for the realization of the Schottky metal zones 41. Referring to FIG. 2A, a plurality of Schottky metal zones 41 respectively arranged at a distance from one another can be provided in such a Schottky metal level, the Schottky metal zones having a spherical geometry, for example. These individual Schottky metal zones 41 can be arranged for example in a rectangular, in one embodiment square, grid, as is illustrated in FIG. 2A. However, these individual Schottky metal zones 41 can also be arranged in any other grid, or even distributed arbitrarily, within the Schottky metal level.

Referring to FIG. 2B, it is also possible to arrange a plurality of Schottky metal zones having a strip-shaped geometry in a component level, the Schottky metal zones respectively being arranged at a distance from one another within the level.

FIG. 2C illustrates a further possible geometry of the Schottky metal zone. In this case, only one Schottky metal zone 41, which has a lattice-shaped structure, is arranged in a Schottky metal level. The lattice illustrated in FIG. 2C has a square lattice structure. However, it is possible to use any further lattice structures, such as e.g., any rectangular lattice structures, hexagonal lattice structures, or others.

The Schottky metal zones 41 are composed of any material suitable for forming a Schottky junction with the semiconductor material of the drift zone 11 that surrounds the Schottky metal zones 41. Suitable materials for the Schottky metal zones are for example platinum (Pt) or gold (Au) or else metal-semiconductor compounds, such as e.g., silicides when using silicon as semiconductor material. Suitable silicides are e.g., tungsten silicide ($WSi_2$), tantalum silicide (TaSi), cobalt silicide (CoSi), titanium silicide (TiSi), palladium silicide (PdSi), rhodium silicide (RhSi) or nickel silicide (NiSi).

The dimensions of the Schottky metal zones 41 in the direction transversely with respect to the current flow direction C and their mutual distance in this direction are chosen such that a largest possible section of the drift zone 11 via which charge carriers can be transported when the component is driven in the on state is present between the Schottky metal zones 41. The dimensions of the Schottky metal zones 41 in the direction transversely with respect to the current flow direction, that is to say the diameter of the spherical zones in accordance with FIG. 2A, and the width of the strip-shaped zones in accordance with FIG. 2B and of the lattice-shaped zones in accordance with FIG. 2C, lie for example between 0.01 μm and 0.25 μm.

The variant with spherical Schottky metal zones as explained with reference to FIG. 2A shall be considered, for example. If it is assumed for the purposes of the explanation that the individual Schottky metal zones have a circular cross section having a diameter of 0.1 μm, for example, and that the individual Schottky metal zones are arranged in a square grid with a grid spacing (center-to-center distance between the individual zones) of 0.5 μm, then the Schottky metal zones 41, in an area transversely with respect to the current flow direction C, take up less than 4% of the available channel cross section. More than 96% of the total cross-sectional area of the drift zone 11—that is to say of the area transversely with respect to the current flow direction C—is available in this case for charge carrier transport when the component is driven in the on state. This cross-sectional area available for charge carrier transport is referred to hereinafter as effective cross-sectional area.

In the case of the strip-shaped geometry of the Schottky metal zones 41 as explained with reference to FIG. 2B, given a strip width of 0.1 μm, the center-to-center distance between the individual strips can be greater than the 0.5 μm explained above in order to achieve the same effective cross-sectional area as in the case of punctiform Schottky metal zones. If, in the case of a lattice-shaped geometry, the width of the individual strips forming the lattice is 0.1 μm, then the grid spacing can likewise be greater than the 0.5 μm in order to achieve the same effective cross-sectional area as in the case of spherical Schottky metal zones 41.

It generally holds true that the dimensions of the Schottky metal zones 41 at least in one of the directions perpendicular to the current flow direction C lie within the range of between 0.01 μm and 0.25 μm and that the Schottky metal zone is realized or the Schottky metal zones are realized in such a way that the proportion of the Schottky metal zone(s) 41 relative to the total area of the Schottky metal levels 40A-40C running perpendicular to the current flow direction C is less than 10%, and in one embodiment less than 5%. The Schottky metal zones 41 thereby impede the charge carrier transport in the drift zone 11 only to a small extent when the component is driven in the on state.

Figure 3:
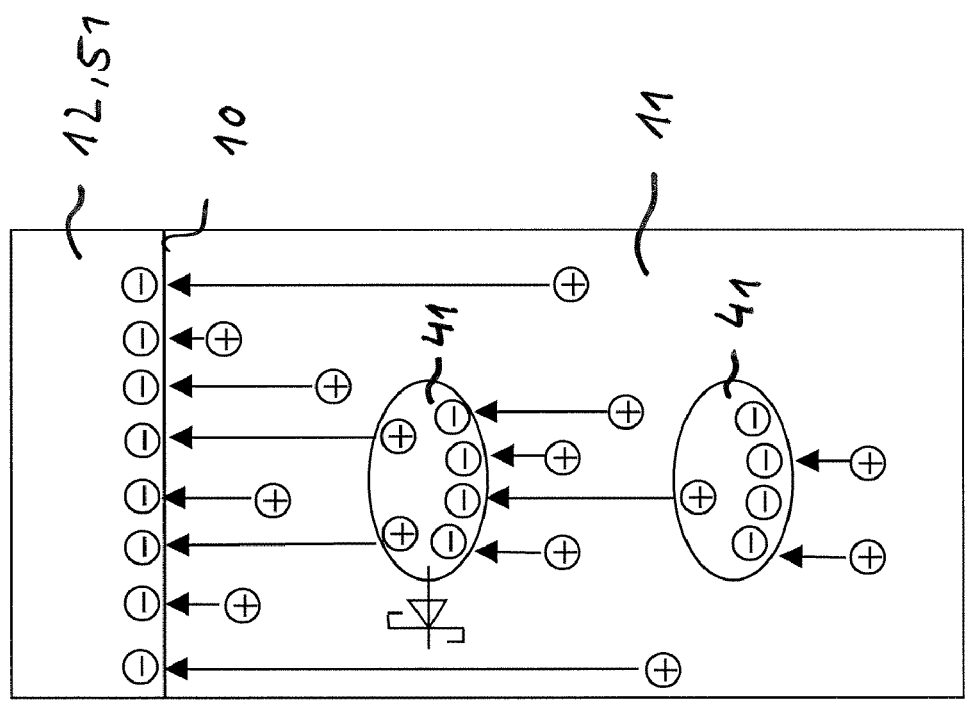
FIG. 3 illustrates an enlarged excerpt from part of the drift zone for elucidating the functional principle of the component in the off-state case.

The functioning of the semiconductor component illustrated with Schottky metal zones 41 arranged in the drift zone 11 is explained below with reference to FIGS. 1 and 3. In this case, FIG. 3 illustrates in an enlarged view an excerpt from the drift zone 11 and the Schottky metal zones 41 arranged therein. FIG. 3 additionally illustrates schematically, for the off-state case of the component, charge carrier distributions in the drift zone 11 and in the first component zone 12, 51 adjoining the drift zone 11.

When the component is driven in the off state, a space charge zone propagates in the drift zone 11 proceeding from the component junction 10. In the region of the space charge zone, in the drift zone 11 ionized dopant atoms—positively charged donor cores in the present case—are present, which are illustrated schematically in FIG. 3. Ionized dopant atoms which in current flow direction C between the component junction 10 and the Schottky metal zone 41 arranged closest to the component junction in this case find their countercharges in the first component zone 12, 51. The countercharges are electrons in the example illustrated.

If the reverse voltage applied to the component junction 10 is high enough that the space charge zone propagates in the current flow direction beyond one or a plurality of Schottky metal zones 41, then charge carriers representing a countercharge with respect to further ionized dopant atoms arranged in the drift zone 11 are accumulated in the Schottky metal zones 41. In the example, the charge carriers are electrons and represent a countercharge with respect to the ionized positively charged donor cores present in the drift zone 11. This accumulation of electrons takes place in the Schottky metal zones predominantly in the region of that side which is remote from the component junction 10, and is possible since the Schottky junction is reverse-biased at least at that side of the Schottky metal zones 41 which is remote from the component junction 10. In other words: when the component is driven in the off state, the Schottky metal zones 41 are at a lower electrical potential than the regions of the drift zone which, in the current flow direction, are adjacent to that side of the Schottky metal zones 41 which is remote from the component junction 10.

The right-hand part of FIG. 1 schematically illustrates the profile of the electric field in the drift zone 11 for a component in the off state. In this case, the electric field is in each case maximal at the component junction 10 and at the Schottky junctions between the Schottky metal zones 41 and the drift zone 11 and in each case decreases until the next Schottky metal zone 41 in the current flow direction. It should be noted in this connection that for the representation of the field profile in FIG. 1 the idealizing assumption was made that the Schottky metal zones 41 have no extent or an extent of zero in the current flow direction. It should additionally be noted in this connection that in the off-state case essentially that region of the Schottky junction between a Schottky metal zone 41 and the drift zone 11 is reverse-biased which is formed between the drift zone 11 and that end of the Schottky zone 41 which is remote from the component junction 10.

In the off-state case, the electrical potential in the drift zone 11 increases continuously proceeding from the component junction 10 in the current flow direction C. In this case, the individual Schottky metal zones 41 are each at the electrical potential prevailing in the drift zone 11 in each case in the region which is adjacent to the respective Schottky metal zone 41 in the direction of the component junction 10. In FIG. 3 they are the regions of the drift zone 11 which are adjacent to the Schottky metal zones 41 directly toward the top.

A portion of the dopant charges present in the drift zone 11 is compensated for by the Schottky metal zones 41 in the manner explained. These dopant charges compensated for by the Schottky metal zones 41 thus no longer contribute to an electric field which is formed by charge carriers on both sides of the component junction 10, that is to say by electrons in the component zone 12, 51, on the one hand, and positive donor cores in the drift zone 11, on the other hand. The doping of the drift zone 11, the mutual distances between the Schottky metal zones 41 in current flow direction C and also the distance between the component junction 10 and the Schottky metal zones 41 closest to the component junction can be coordinated with one another in such a way that a critical electric field strength is not reached when the component is driven in the off state. The critical electric field strength is between $2.5 \cdot 10^5$ V/cm and $1 \cdot 10^6$ V/cm for silicon depending on the doping.

The critical electric field strength can be prevented from being reached if the surface charge in the region over which extends an electric field which proceeds from the component junction 10 or which proceeds from the Schottky junctions between the Schottky metal zones 41 and the drift zone 11 is less than the maximum surface charge. The maximum surface charge is also referred to as breakdown charge and is approximately $2 \cdot 10^{12}$ cm$^{-2}$ for silicon. The surface doping for a given volume region of the drift zone 11 is obtained by integrating the dopant charges or dopant atoms present in the volume region in current flow direction C. In the case of the component illustrated in FIG. 1, the critical field strength is not reached when the surface charge in the volume region between the component junction 10 and the first Schottky metal zone level 40A is less than the breakdown charge, and when the surface charges of the volume regions arranged between two Schottky metal levels in each case are less than the breakdown charge.

The drift zone 11 can be doped homogeneously, but can also have a varying doping. In this case, the doping concentration can vary in one embodiment in the current flow direction C. Through such variation of the doping concentration, it is possible to set in one embodiment the location of a first voltage breakdown in the drift zone 11. Such a voltage breakdown occurs if a maximum dielectric strength of the component is reached. At the location at which a first voltage breakdown is intended to commence, the doping concentration is chosen for example to be higher than in remaining regions of the drift zone 11. Such a local increase in the doping concentration is present in one embodiment in that region of the drift zone 11 which is adjacent in the current flow direction to the Schottky zones that are at the furthest distance from the component junction 10. In the case of the component in accordance with FIG. 1, they are the Schottky metal zones of the Schottky metal level designated by the reference symbol 40D. In this case, the doping concentration can be increased locally in one embodiment to an extent such that the surface charge in a section of the drift zone 11 between the Schottky metal zones and that end of the drift zone 11 which is remote from the component junction 10 is greater than the breakdown charge. Such a local increase in the doping concentration is present for example in such a region of the drift zone 11 which, in a direction perpendicular to the current flow direction C, is at a distance from an edge of the drift zone 11 or of a semiconductor body in which it is arranged. As an alternative or in addition to a local increase in the doping concentration, in a region in which a voltage breakdown is intended to commence first it is possible to increase the spacing of the Schottky metal zones in current flow direction C with respect to remaining regions of the drift zones 11.

The maximum dielectric strength of the component illustrated in FIG. 1 is essentially determined by the dimensions of the drift zone 11 in current flow direction C. It holds true here that the dielectric strength is all the higher, the larger the dimensions of the drift zone 11 in current flow direction are. It holds true as a rule of thumb for silicon, for example, that the dimensions of the drift zone 11 in current flow direction C per 100 V of desired dielectric strength are approximately 10 μm.

The on resistance of the component is determined in the driven-on state by the doping concentration of the drift zone 11. It holds true here that the on resistance is all the lower, the more highly doped the drift zone 11 is. With increasing doping of the drift zone 11, it is necessary in this case to provide more Schottky metal zones 41 arranged at a distance from one another in the current flow direction, in order to meet the abovementioned condition that the surface doping in a volume region between two Schottky metal levels is less than the breakdown charge.

The concept explained above, namely of providing at least one Schottky metal zone 41 in a drift zone 11 of a semiconductor component, can be applied to any semiconductor components including a drift zone. Some examples of such components are explained below with reference to FIGS. 4 to 8.

Figure 4:
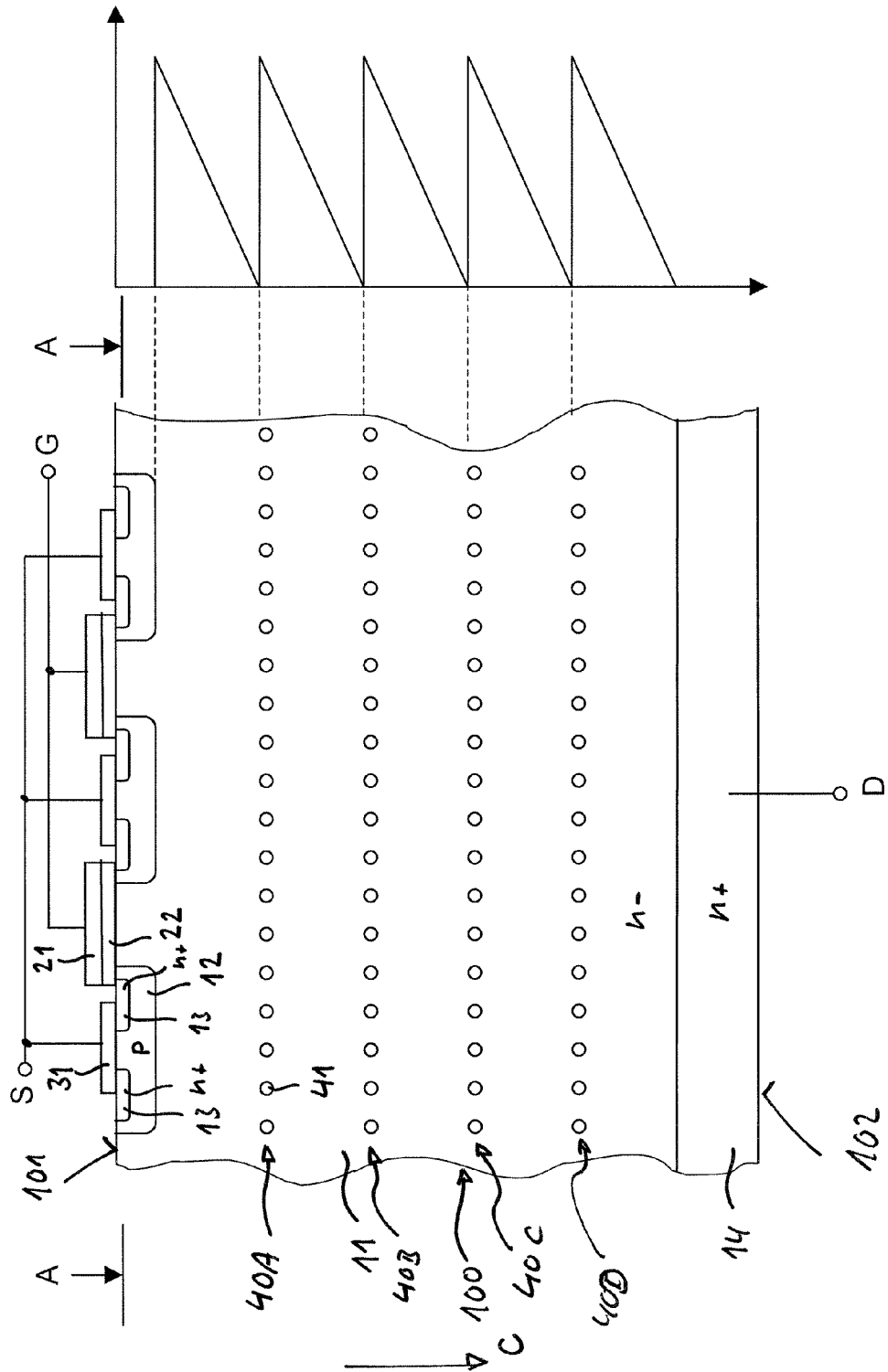
FIG. 4 illustrates a cross section through a semiconductor component formed as a vertical MOS transistor.

FIG. 4 illustrates a cross section through a semiconductor component formed as a MOS transistor. In this component, the first component zone 12, which is adjacent to the drift zone 11, is a semiconductor zone 12 doped complementarily to the drift zone 11, which semiconductor zone forms a body zone of the MOS transistor. The component additionally has a source zone 13 of the same conduction type as the drift zone 11, which is separated from the drift zone 11 by the body zone 12. In order to control a conducting channel in the body zone 12 between the source zone 13 and the drift zone 11, a gate electrode 21 is present, which is arranged adjacent to the body zone 12 and which is dielectrically insulated from the body zone 12 by a gate dielectric 22. In this case, the gate electrode 21 extends adjacent to the body zone 12 from the source zone 13 as far as the drift zone 11.

The MOS transistor illustrated in FIG. 4 is realized as a vertical MOS transistor. In this component, the current flow direction C runs in the vertical direction of a semiconductor body 100 in which the drift zone 11, the body zone 12 and the source zone 13 are arranged. In this case, a "vertical direction" of the semiconductor body 100 is a direction of the semiconductor body 100 which runs perpendicular to a first side 101, which is referred to hereinafter as front side, and to a second side 102, which is referred to hereinafter as rear side. In the component illustrated, the source zone 13 and the body zone 12 are arranged in the region of a front side 101 of the semiconductor body. In the direction of the rear side 102, there is adjacent to the drift zone 11 a drain zone 14, which is doped more highly than the drift zone 11 and which, in the case of a MOS transistor formed as a MOSFET, is of the same conduction type as the drift zone 11, and which, in the case of a MOSFET formed as an IGBT, is doped complementarily to the drift zone 11. In the case of an IGBT, a field stop zone (not illustrated) may be provided between the drift zone 11 and the drain zone 14, the field stop zone being of the same conduction type as the drift 11 but it being doped more highly.

The transistor illustrated in FIG. 4 is an n-conducting transistor and has an n-doped source zone 13, and also a p-doped body zone 12. It should be pointed out that the concept explained can also be applied to p-conducting components, that is to say Schottky metal zones arranged in floating fashion can also be provided in a p-doped drift zone. The fundamental switching behavior of the MOS transistor illustrated in FIG. 4 corresponds to that of a conventional MOS transistor. The transistor is turned on if a positive voltage is present between the drain zone 14 and the source zone 13, and if the gate electrode 21 is at a suitable drive potential resulting in the formation of an inversion channel along the gate dielectric 22 between the source zone 13 and the drift zone 11. The transistor is turned off if a positive voltage is present between the drain zone 14 and the source and body zone 13, 12 and if an electrical potential suitable for forming an inversion channel is not present at the gate electrode 21. In this case, proceeding from the pn junction between the body zone 12 and the drift zone 11, a space charge zone propagates in the vertical direction in the semiconductor body 100. As soon as the space charge zone encroaches on the Schottky metal zones 41 in this case, part of the dopant charge present in the drift zone 11 is compensated for by the Schottky metal zones 41 in the manner explained. In the component illustrated, the body zone 12 is at the potential of the source zone 13. For this purpose, contact is made with the source zone 13 and the body zone 12 jointly by a source electrode 31. In FIG. 4, the current flow direction C designates the physical current direction, that is to say the direction of the flow of electrons.

When the component is driven in the off state, the electrical voltage present between the drain zone 14 and the source and body zone 13, 12 is essentially dropped across the drift zone 11. In this case, the Schottky metal zones 41 are at electrical potentials which in terms of magnitude lie between the electrical potential at the source electrode 31 and the electrical potential at the drain zone 14. In this case, the electrical potentials become larger proceeding from the pn junction in the direction of the drain zone 14 from Schottky metal level toward Schottky metal level. Depending on the vertical dimensions of the drift zone 11, the maximum reverse voltage can be set as desired.

If the component is subsequently driven in the on state by a suitable electrical potential being applied to the gate electrode 21, then charge carriers are injected into the drift zone. The charge carriers, which are electrons in the case of the n-conducting component illustrated, "neutralize" a portion of the positively charged donor cores that are initially still present in the drift zone 11 directly after the switch-on, wherein the reverse voltage established in the off-state case between the Schottky metal zones 41 and the surrounding drift zone 11 is initially still maintained. If positively charged donor cores in the drift zone are neutralized by electrons that have flowed in, a portion of the electrons which were accumulated in the Schottky metal zones 41 in the off-state case no longer find a counter charge in the drift zone 11. As a result, the electrons flow from the Schottky metal zones 41 into the drift zone 11, where they neutralize further donor cores, which leads to a further flowing away of electrons from the Schottky metal zones 41, etc. In this way, the reverse voltage, or the space charge zone present between the Schottky metal zones 41 and the drift zone 11, is rapidly reduced and the component is fully turned on. Discharging the Schottky metal zones 41 prevents space charge zones from being present around the Schottky metal zones 41 when the component is driven in the on state, which space charge zones would unnecessarily reduce the on resistance of the component. A rapid discharge of the Schottky metal zones 41 when the component is driven in the on state is ensured by virtue of the fact that electrons in the n-doped drift zone 11 are majority charge carriers. Consequently, it is not necessary for the Schottky metal zones 41 to be connected to a fixedly predetermined potential in order to discharge the Schottky metal zones 41. As a result, the Schottky metal zones 41 can be arranged in floating fashion in the drift zone 11 in a space-saving manner, that is to say that they do not have to be connected to a predetermined electrical potential and they can be completely surrounded by the drift zone.

Figure 5A:
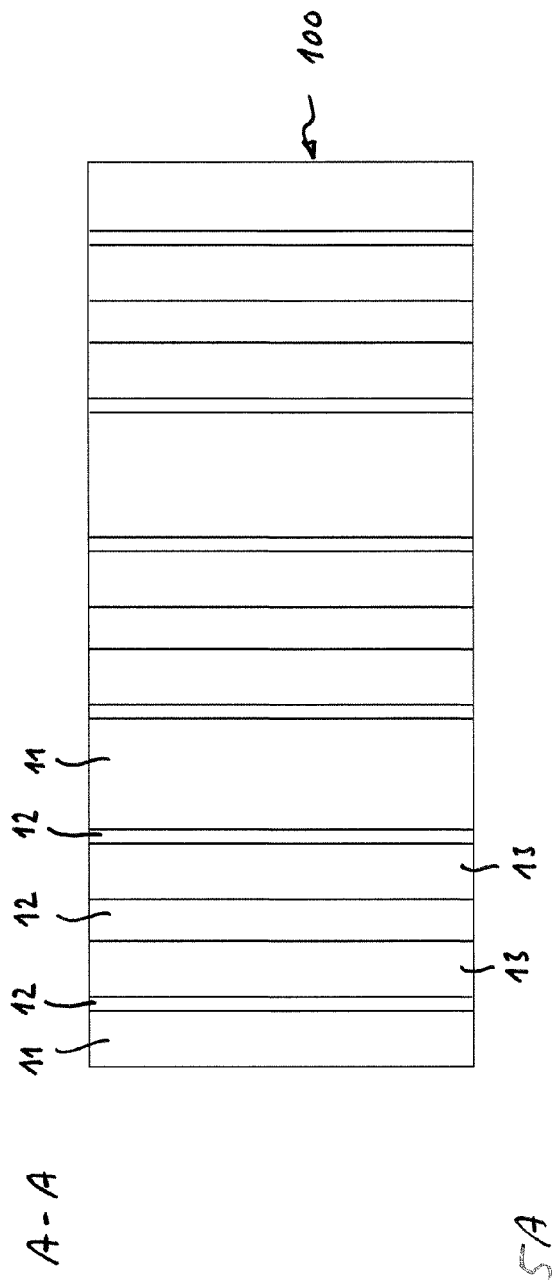
FIG. 5 illustrates examples of different cell geometries for a semiconductor component formed as a MOS transistor.

The MOS transistor illustrated in FIG. 4 is constructed in cellular fashion and has a multiplicity of transistor cells of identical type, each having a body zone 12, a source zone 13 and a gate electrode 21. In this case, the drift zone 11 and the drain zone 14 are common to all the transistor cells. The individual transistor cells can have a conventional cell geometry and can be realized in one embodiment in strip-shaped fashion or in polygonal fashion, in one embodiment in hexagonal fashion. FIG. 5A illustrates a cross section along the sectional plane A-A illustrated in FIG. 4 for a component having a strip-shaped cell geometry. In this case the body zone 12 and the source zone 13 are realized as strips whose longitudinal extension runs in a direction perpendicular to the plane of the drawing illustrated in FIG. 4. For contact-connection by the source electrode 31, the body zone of each cell has a section extending as far as the front side 101 of the semiconductor body.

Figure 5B:
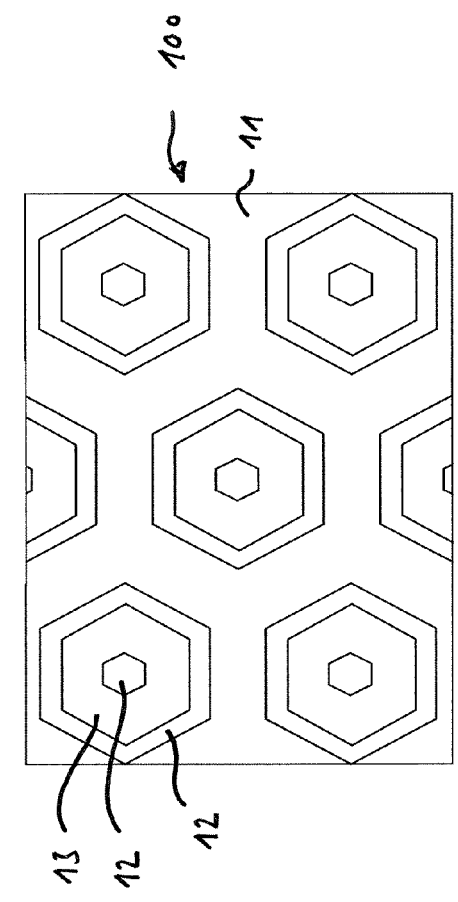

FIG. 5B illustrates a cross section along the sectional plane A-A for a component having a hexagonal cell geometry. The body zones 12 and the source zone 13 have a hexagonal geometry in this component.

The transistor illustrated in FIG. 4 is realized as a planar MOS transistor. In this component, the gate electrode 21 is arranged above the front side 101 of the semiconductor body. In this case, the gate electrode 21 can be realized as a continuous electrode layer having cutouts in which the source electrode 31 makes contact with the source zone 13 and the body zone 12. In this planar MOS transistor, the drift zone 11 has sections extending between two adjacent body zones 12 below the gate electrode 21 as far as the front side 101 of the semiconductor body.

Figure 6:
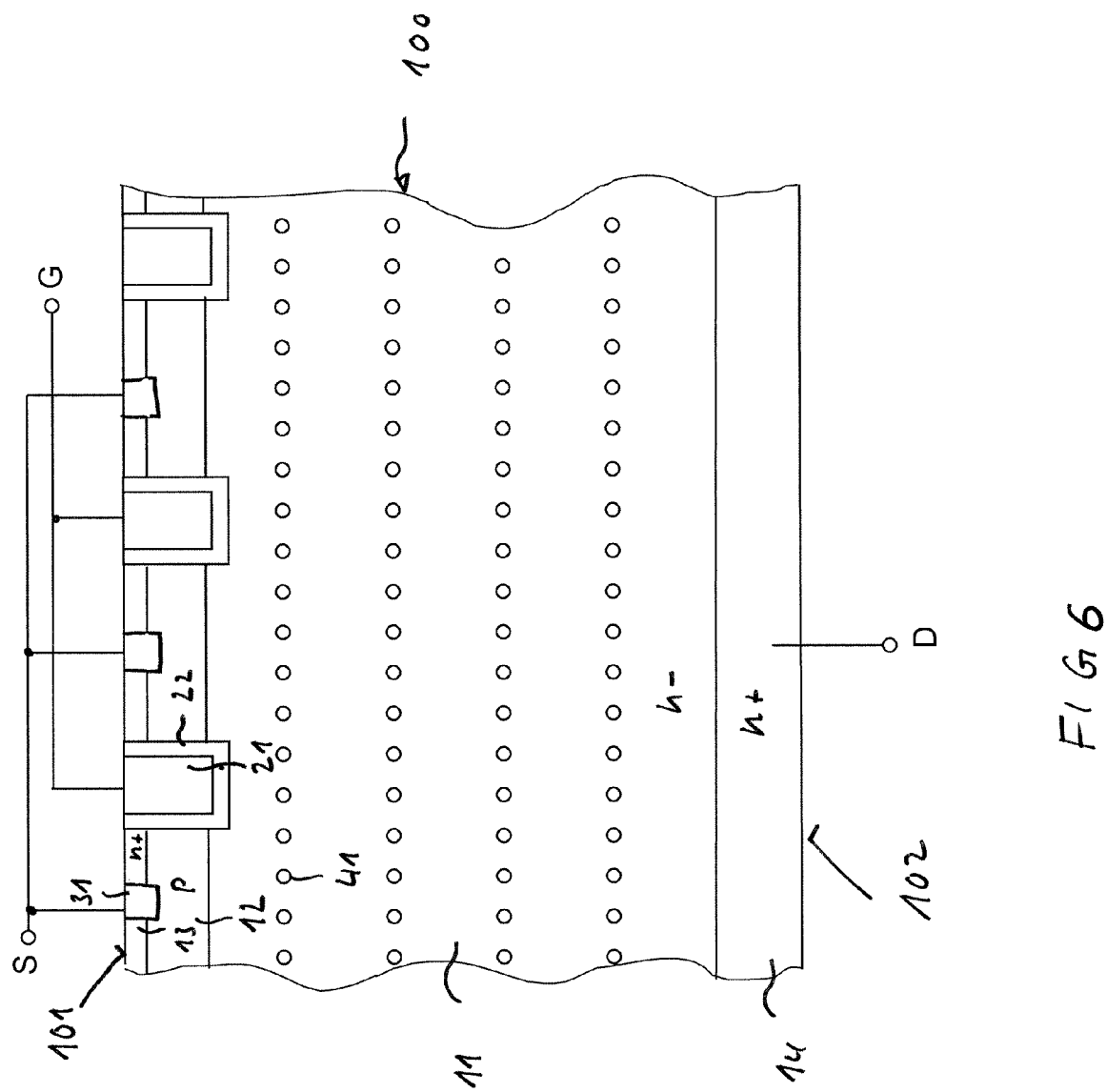
FIG. 6 illustrates a cross section through a further semiconductor component formed as a vertical MOS transistor.

It goes without saying that Schottky metal zones can be provided in the drift zones of transistors having any desired geometry, such as, for example, in the case of trench transistors. FIG. 6 illustrates such a trench transistor in cross section. This transistor differs from the one illustrated in FIG. 4 essentially by virtue of the fact that the gate electrodes of the individual transistor cells are arranged in trenches which extend into the semiconductor body in the vertical direction proceeding from the front side 101. While in the planar MOS transistor in accordance with FIG. 4, the inversion channel propagates along the front side 101 in the body zone 12 when the component is driven in the on state, this inversion channel, in the trench transistor illustrated in FIG. 6, runs in the vertical direction of the semiconductor body within the body zone 12. In the component illustrated in FIG. 6, the source electrode 31 extends into the semiconductor body in the vertical direction proceeding from the front side 101 in order to make contact with both the source zone 13 and the body zone 12. As an alternative, the source electrode 13 could also be realized as a planar electrode, in a manner not illustrated in more specific detail. In this case, the body zone 12 would extend in sections as far as the front side 101.

Figure 7:
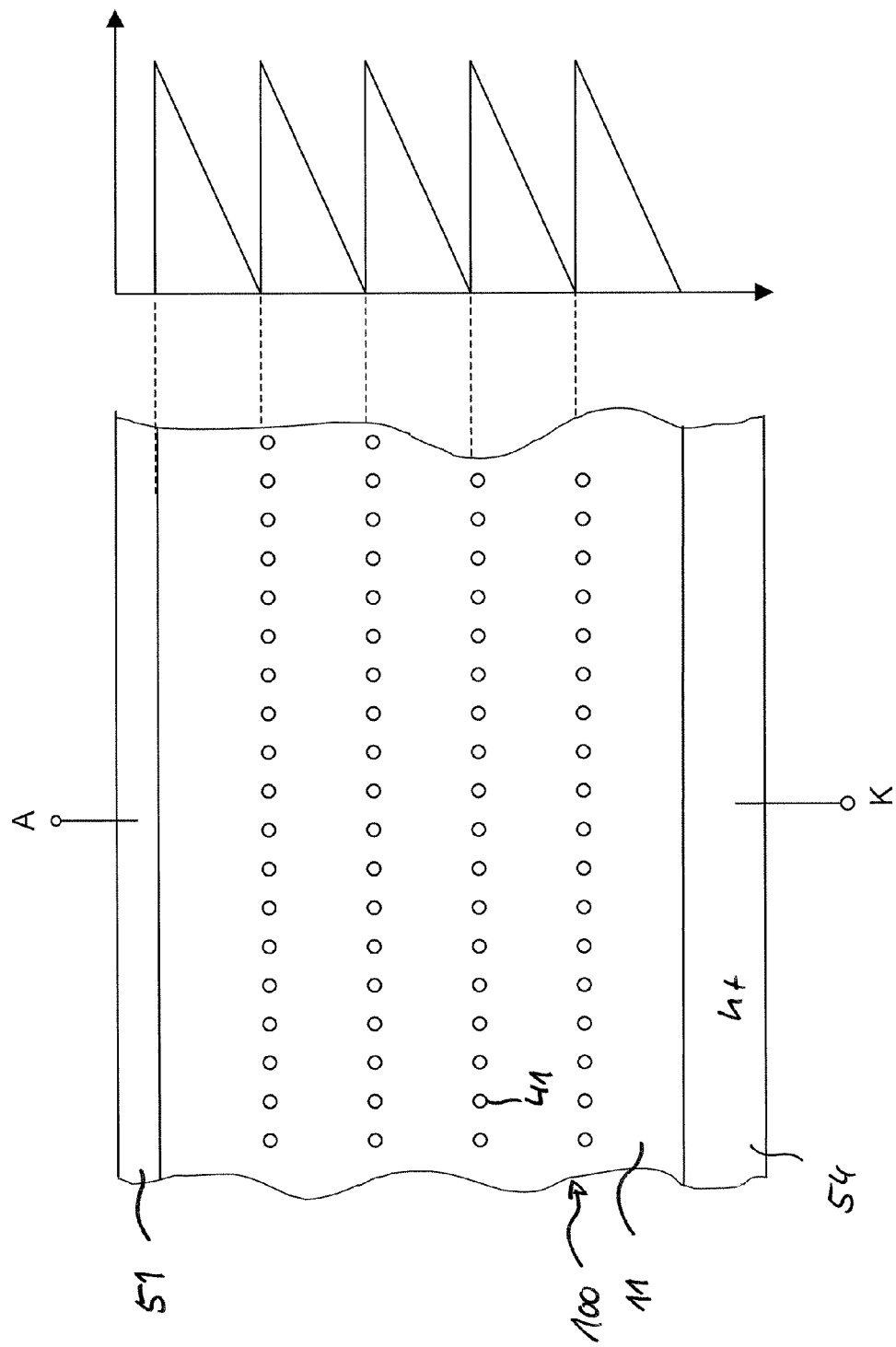
FIG. 7 illustrates a cross section through a semiconductor component formed as a diode.

Referring to FIG. 7, a drift zone 11 with Schottky metal zones 41 arranged therein can also be provided in the case of a Schottky diode. FIG. 7 illustrates an excerpt from a cross section through such a Schottky diode. In this component, the first component zone 51 adjacent to the drift zone 11 is a further Schottky metal zone 51, which forms an anode zone of the Schottky diode. A cathode zone 54 is adjacent to a side of the drift zone 11 that is opposite to the further Schottky metal zone 51. The cathode zone 54 is a semiconductor zone of the same conduction type as the drift zone 11, but doped more highly. The Schottky diode illustrated is turned on when a positive voltage is applied between an anode connection A, which makes contact with the Schottky metal zone 51 and which is illustrated only schematically, and a cathode connection K, which makes contact with the cathode zone 14 and which is likewise illustrated only schematically. The component is turned off when a negative voltage is applied between anode A and cathode K or when a positive voltage is applied between cathode K and anode A. In this case, a space charge zone propagates in the manner explained proceeding from the Schottky junction 10, formed between the further Schottky metal zone 51 and the drift zone 11, in the drift zone 11. With increasing voltage, the space charge zone encroaches on the Schottky metal zones 41 arranged at a distance from one another in current flow direction C.

A drift zone with Schottky metal zones 41 arranged therein can also be provided in the case of bipolar diodes, in a manner not illustrated in more specific detail. Such a bipolar diode differs from the Schottky diode illustrated in FIG. 7 only by virtue of the fact that a semiconductor zone doped complementarily to the drift zone 11 is provided instead of the further Schottky metal zone 51, the semiconductor zone forming an anode zone. This bipolar diode, in a manner corresponding to the Schottky diode, is turned on when a positive voltage is applied between anode A and cathode K and is turned off when a negative voltage is applied between the component connections.

Figure 8:
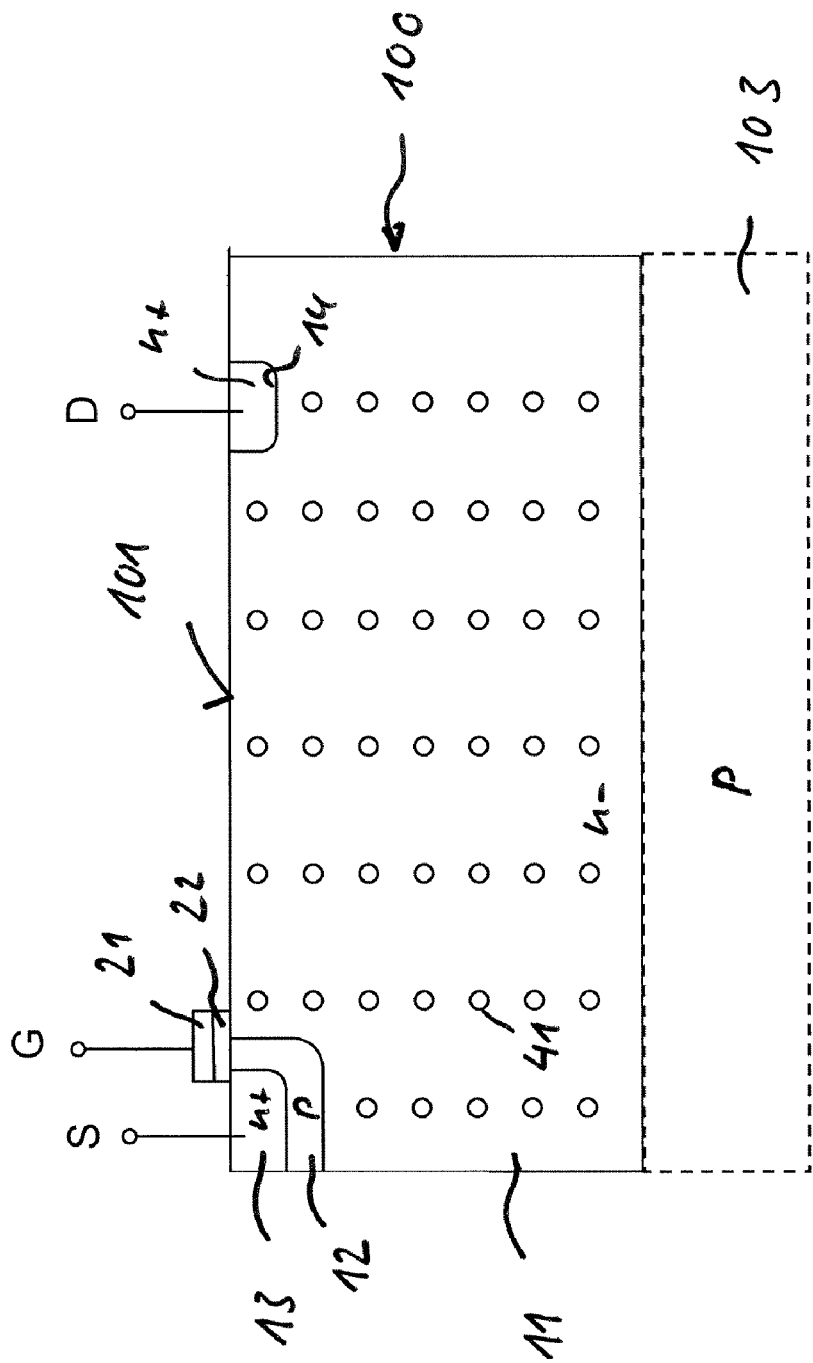
FIG. 8 illustrates a cross section through a lateral semiconductor component.

The concept explained above of providing Schottky metal zones 41 in the drift zone 11 of a semiconductor component can be applied not only to vertical components, such as, for example, the vertical MOS transistors illustrated in FIGS. 4 and 6, but can also be applied in the same way to lateral semiconductor components. FIG. 8 illustrates a cross section through a lateral MOS transistor having a drift zone 11 with Schottky metal zones 41 arranged in the drift zone 11. In this component, the drain zone 14 and the source zone 13 are arranged at a distance from one another in a lateral direction of the semiconductor body 100. In a corresponding manner, in this component the current flow direction C runs in a lateral direction, that is to say essentially parallel to the front side 101 of the semiconductor body. The transistor illustrated in FIG. 8 is realized as a planar transistor. In this case, the gate electrode 21 is arranged above the front side 101 of the semiconductor body 100. It should be pointed out that this component geometry only serves for illustrating the basic concept, and that any further component geometries can be used, in one embodiment sidewall geometries, in which the gate electrode 21 is arranged in a trench extending into the semiconductor body 100 proceeding from the front side 101.

The further construction of the component can correspond to the construction of conventional lateral MOS transistors. Thus, the drift zone 11 can be for example a semiconductor layer which can be arranged above a semiconductor layer—in one embodiment a semiconductor substrate—doped complementarily to the drift zone. Such a semiconductor substrate is designated by the reference symbol 103 and illustrated by dashed lines in FIG. 8.

Figure 9A:
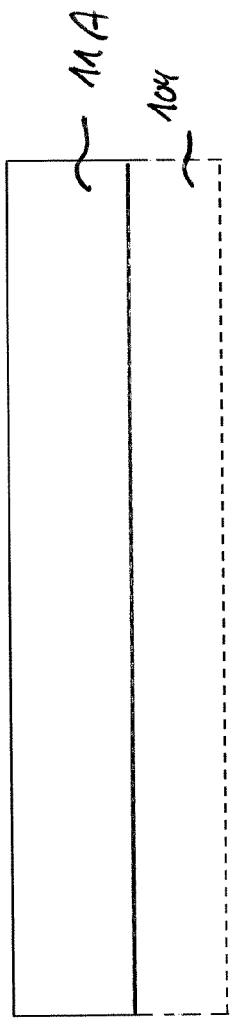
FIG. 9 illustrates a method for producing a drift zone and Schottky metal zones arranged in the drift zone.

A possible method for producing a drift zone 11 with Schottky metal zones 41 arranged in the drift zone is explained below with reference to FIGS. 9A to 9C. These figures in each case illustrate a cross section through the drift zone during different method processes of the production method. Referring to FIG. 9A, the method provides for firstly providing a first semiconductor layer 11A. The semiconductor layer 11A can be an epitaxial layer arranged on a semiconductor substrate 104 (illustrated by dashed lines). In the case where a vertical semiconductor component is realized, the semiconductor substrate 104 can form one of the later component zones, for example the drain zone of a MOS transistor or the cathode zone of a diode. In the case where a lateral semiconductor component is realized, the semiconductor substrate 104 can fulfill for example the function of the semiconductor substrate 103 illustrated by dashed lines in FIG. 8.

Figure 9B:
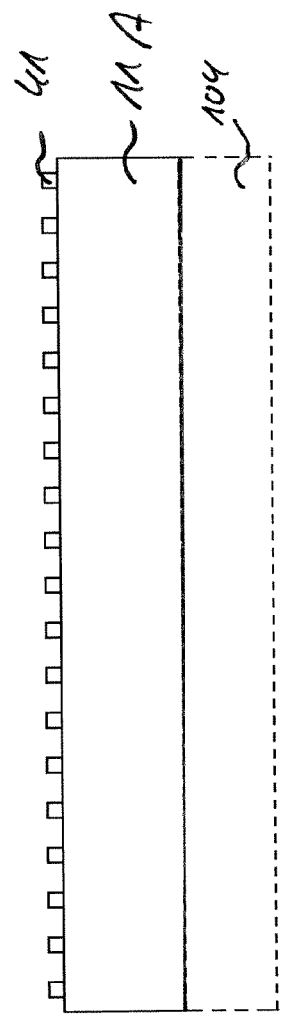
Figure 9C:
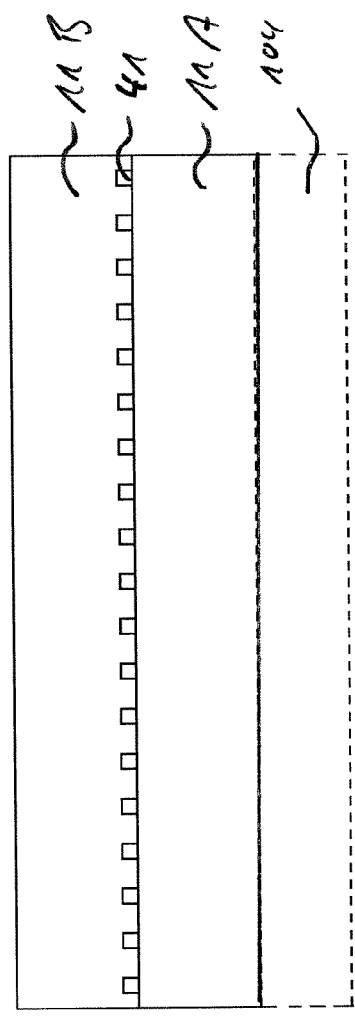

Referring to FIG. 9B, a structure with at least one Schottky metal zone 41 is subsequently applied to the first semiconductor layer 11A. The structure is produced for example by masked deposition of a material suitable for producing the Schottky metal zones, for example a metal or a silicide. The structure with the at least one Schottky metal zone 4 can have any of the geometries explained above, in one embodiment one of the geometries explained with reference to FIGS. 2A to 2C.

A further semiconductor layer 11B is subsequently applied to the arrangement including the first semiconductor layer 11A and the structure with at least one Schottky metal zone 41 that was applied on the first semiconductor layer. The further semiconductor layer is deposited epitaxially, for example, wherein the structure with the at least one Schottky metal zone 41 is overgrown in monocrystalline fashion in this case, such that a defect in the crystal lattice of the later drift zone does not occur, or does not occur to a significant extent, owing to the at least one Schottky metal zone. The result of this further method process in which the further semiconductor layer 11B is produced is illustrated in FIG. 9C.

The method processes explained above with reference to FIGS. 9A to 9C can be carried out successively a number of times, thus giving rise to a layer stack having a plurality of semiconductor layers which are arranged successively and between which a structure with at least one Schottky metal zone 41 is respectively arranged.

As an alternative to producing the Schottky metal zones 41 by one or a plurality of deposition processes, suitable metal atoms can also be implanted into regions near the surface of the semiconductor layer 11A in masked fashion. This implantation is followed by a thermal process, as a result of which the implanted metal atoms form a silicide with the surrounding semiconductor material. If a plurality of semiconductor layers are deposited one above another, into which metal atoms are in each case implanted, then a thermal process can be carried out after each implantation. As an alternative, a single thermal process can be carried out after producing a plurality of semiconductor layers, or after carrying out a plurality of implantation processes, which leads to the formation of silicides in all the regions into which metal atoms were implanted previously.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor component comprising:
   a drift zone of a first conduction type; and
   at least one floating Schottky metal zone arranged in the drift zone.

2. The semiconductor component of claim 1, comprising a plurality of Schottky metal zones arranged at a distance from one another in a current flow direction of the semiconductor component in the drift zone.

3. The semiconductor component of claim 1, comprising wherein a plurality of Schottky metal zones are arranged at a distance from one another in a plane running transversely with respect to a current flow direction.

4. The semiconductor component of claim 3, comprising wherein the mutual distance between the Schottky metal zones arranged at a distance from one another in the current flow direction is substantially identical in each case.

5. The semiconductor component of claim 3, comprising wherein the mutual distance between the Schottky metal zones arranged at a distance from one another in the current flow direction vanes.

6. The semiconductor component of claim 1, comprising wherein the at least one Schottky metal zone has a lattice-shaped geometry.

7. The semiconductor component of claim 1, comprising wherein the at least one Schottky metal zone has a strip-shaped geometry or a spherical geometry.

8. The semiconductor component of claim 7, comprising wherein a plurality of Schottky metal zones are present are arranged at a distance from one another in a direction transversely with respect to a current flow direction of the semiconductor component.

9. The semiconductor component of claim 1, comprising wherein the Schottky metal zone comprises a silicide.

10. The semiconductor component of claim 9, comprising wherein the Schottky metal zone comprises at least one of the following materials: tungsten silicide, tantalum silicide, cobalt silicide, titanium silicide.

11. The semiconductor component of claim 1, comprising wherein the drift zone is arranged in a semiconductor body and has a current flow direction running in a vertical direction of the semiconductor body.

12. The semiconductor component of claim 11, furthermore comprising:
   a drain zone of the first or second conduction type, said drain zone being adjacent to the drift zone at an opposite side to the body zone and being doped more highly than the drift zone.

13. The semiconductor component of claim 1, comprising wherein the drift zone is arranged in a semiconductor body and has a current flow direction running in a lateral direction of the semiconductor body.

14. The semiconductor component of claim 1, formed as a MOS transistor and comprising:
   a body zone of a second conduction type, complementary to the drift zone, said body zone being adjacent to the drift zone;
   a source zone of the second conduction type, said source zone being separated from the drift zone by the body zone; and
   a gate electrode arranged adjacent to the body zone, and a gate dielectric arranged between the body zone and the gate electrode.

15. The semiconductor component of claim 1, formed as a bipolar diode and comprising:
   an anode zone of a second conduction type, complementary to the drift zone, said anode zone being adjacent to the drift zone.

16. The semiconductor component of claim 1, formed as a Schottky diode and comprising:
   a further Schottky metal zone, adjacent to the drift zone and contact-connected by a connection contact.

17. An integrated circuit comprising:
   a semiconductor body;
   a drift zone of a first conduction type, said drift zone being arranged in the semiconductor body;
   a plurality of Schottky metal zones arranged at a distance from one another in a current flow direction of the component in the drift zone; and
   a component junction between the drift zone and a doped component zone of a second conduction type, complementary to the first conduction type, or between the drift zone and a further Schottky metal zone, contact-connected by a connection contact.

18. The semiconductor component of claim 17, which is realized as a MOS transistor and wherein the component zone is a body zone.

19. The semiconductor component of claim 17, which is realized as a diode and wherein the component zone is an anode zone.

20. A method for producing a semiconductor component comprising a drift zone and at least one Schottky metal zone arranged in the drift zone, wherein the production of the drift zone and of the at least one Schottky metal zone comprises:

providing a semiconductor layer of a first conduction type;

producing the at least one Schottky metal zone at a first surface of the semiconductor layer; and applying a further semiconductor layer to the first surface and the at least one Schottky metal zone.

21. The method of claim 20, comprising effecting applying the further semiconductor layer by epitaxially depositing a semiconductor material.

22. A semiconductor component comprising:

means for providing a drift zone; and means for providing at least one floating Schottky metal zone arranged in the drift zone.

* * * * *